United States Patent [19]
Ogawa

[11] Patent Number: 5,389,924
[45] Date of Patent: Feb. 14, 1995

[54] MULTIPLE CHARACTER CODE SET INPUT/OUTPUT CONVERSION SYSTEM

[75] Inventor: Yuji Ogawa, Tokyo, Japan

[73] Assignee: NEC Corporation, Tokyo, Japan

[21] Appl. No.: 14,152

[22] Filed: Feb. 8, 1993

[30] Foreign Application Priority Data

Feb. 6, 1992 [JP] Japan .................. 4-056240

[51] Int. Cl.$^6$ ............................................. H03M 7/00
[52] U.S. Cl. ...................................... 341/106; 341/55; 364/DIG. 2
[58] Field of Search ........................... 341/50, 55, 106; 364/DIG. 1, DIG. 2

[56] References Cited

U.S. PATENT DOCUMENTS

| | | | |
|---|---|---|---|
| 4,692,896 | 9/1987 | Sakoda et al. | 364/900 |
| 4,727,511 | 2/1988 | Sekiguchi | 364/900 |
| 4,992,957 | 2/1991 | Aoyama et al. | 364/519 |
| 5,028,923 | 7/1991 | Seki et al. | 341/106 |

Primary Examiner—Howard L. Williams
Attorney, Agent, or Firm—Foley & Lardner

[57] ABSTRACT

In a computer system provided with a plurality of computers handling different types of character code sets, a multiple character code set input/output conversion system according to the present invention converts character code strings based on a character code set used in a text file into internal character code strings based on the internal character code set commonly used by the plurality of computers and in turn converts the internal character code strings into character code strings based on a specific character code set. The code conversion means to convert input character code strings to internal character code strings based on the internal character code string and internal character code strings to other character code strings comprises a plurality of code conversion programs which convert character code strings into internal character code strings and internal character code strings to character code strings, a plurality of conversion tables with arrays of addresses for invoking code conversion programs and table registers where pointers to applicable conversion tables are set.

9 Claims, 12 Drawing Sheets

|  | FIRST BYTE | SECOND BYTE | THIRD BYTE |
|---|---|---|---|
| ASCII CHARACTER | 00~7F | ............ | ............ |
| KANJI CHARACTER | 80~FF | 80~FF | ............ |
| HALF SIZE KANA CHARACTER | 8E | 80~FF | ............ |
| EXTERNAL CHARACTER | 8F | 80~FF | 80~FF |

FIG. 3

|  | FIRST BYTE | SECOND BYTE |
|---|---|---|
| ASCII CHARACTER | 00 | 00~7F |
| KANJI CHARACTER | 80~FF | 80~FF |
| HALF SIZE KANA CHARACTER | 00 | 80~FF |
| EXTERNAL CHARACTER | 80~FF | 00~7F |

| "A" (ASCII) | "B" (ASCII) | "C" (ASCII) | "NI" (KANJI) | "HON" (KANJI) | "GO" (KANJI) | "A" (KANA) | "I" (KANA) | "U" (KANA) |
|---|---|---|---|---|---|---|---|---|
| 61 | 62 | 63 | C6FC | CBDC | B8EC | 8EB1 | 8EB2 | 8EB3 |

FIG. 12B

| "A" (ASCII) | "B" (ASCII) | "C" (ASCII) | K I | "NI" (KANJI) | "HON" (KANJI) | "GO" (KANJI) | K O |
|---|---|---|---|---|---|---|---|
| 61 | 62 | 63 | 1B2442 | 467C | 4B5C | 386C | 1B284A |

| "A" (KANA) | "I" (KANA) | "U" (KANA) |
|---|---|---|
| B1 | B2 | B3 |

FIG. 12C

| "A" (ASCII) | "B" (ASCII) | "C" (ASCII) | "NI" (KANJI) | "HON" (KANJI) | "GO" (KANJI) | "A" (KANA) |
|---|---|---|---|---|---|---|
| 0061 | 0062 | 0063 | C6FC | CBDC | B8EC | 00B1 |

FIG. 12D

| "I" (KANA) | "U" (KANA) |
|---|---|
| 00B2 | 00B3 |

MULTIPLE CHARACTER CODE SET INPUT/OUTPUT CONVERSION SYSTEM

BACKGROUNDS OF THE INVENTION

1. Field of the Invention

The present invention relates to an input/output conversion system for multiple character code sets in a computer system where different character code sets are handled in multiple, i.e. a computer system where processing is executed among a plurality of computers each of which utilizes a character code set different from others.

2. Description of the Prior Art

With information processing systems using computers becoming more and more diversified and complicated recently, distributed processing systems are increasingly adopted. In such systems, a plurality of computers connected via communication media are used at a time so as to share necessary processing among them.

Such computer systems give rise to a problem which has been overlooked so far: text codes expressed with a certain character code set may be processed by a computer using another character code set.

Suppose a certain result of processing at computer A is output to a text file b and the text file b is processed by B, for example. Since computers A and B have different code sets, the text file b cannot be input directly to computer B.

To cope with such a problem, conventional systems utilize input/output conversions for multiple character code sets. In conventional input/output conversions for multiple character code sets, it is necessary to convert the character code set in advance corresponding to the computer to which the text file is output or input. This results in existence of a plurality of text files with the same contents but with different character code sets.

Thus, when a text file is commonly used by a plurality of computers with different definitions of character code sets, a plurality of text files are required. Since a text file defined with a certain character code set cannot be directly input or output to a plurality of computers for different character code sets, the same contents need to be expressed in a plurality of text files at a time for different character code sets usable by different computers. The need of a plurality of text files having the same contents to be processed at a plurality of computers results in requirement of conversion processes for a plurality of text files and resources to handle a plurality of text files.

SUMMARY OF THE INVENTION

An object of the present invention is to provide a multiple character code set input/output conversion system which enables sharing of a text file expressed with a specific character code set among a plurality of computers handling different character code sets without preparing a plurality of text files with the same contents but in different character code sets.

Another object of the present invention is to provide a multiple character code set input/output conversion system which eliminates the need of resources to handle a plurality of text files having the same contents but in different character code sets.

According to a preferred embodiment of the present invention to attain the above objects, a multiple character code set input/output conversion system for a computer system provided with a plurality of computers handling different kinds of character code sets comprises an input character code conversion means which converts character code strings based on a character code set used in a text file into internal character code strings based on the internal character code set commonly used by the plurality of computers and an output character code conversion means which converts the internal character code strings to other character code strings based on a specific character code set.

According to a further preferred embodiment of a multiple character code set input/output conversion system of the present invention, the input character code conversion means further comprises a plurality of code conversion programs to convert character code strings based on a plurality of character code sets to internal character code strings based on the internal character code set and a plurality of input conversion tables with arrays of addresses to invoke the code conversion programs and the output character code conversion means further comprises a plurality of code conversion programs to covert character code strings based on the internal character code set to character code strings based on a plurality of character code sets and a plurality of output conversion tables with arrays of addresses to invoke the code conversion programs. Further, the input conversion table and the output conversion table use the values of the character codes to be converted as indices for arrays.

According to a still preferred embodiment of a multiple character code set input/output conversion system of the present invention, the input character code conversion means further comprises a table register to set the pointer to the input conversion table for character code set conversion to which the input character code corresponds and the output character code conversion means further comprises a table register to set the pointer to the output conversion table for character code set conversion to which the character code string to be output corresponds. Preferably, the multiple character code set input/output conversion system further comprises an input character code string storage to store character code strings to be converted to internal character code strings based on the internal character code set by the input character code conversion means, an internal character code string storage to store the converted internal character code strings and an output character code storage to store character code strings converted from the internal character code strings based on the internal character code set by the output character code conversion means.

According to another preferred embodiment of the present invention to attain the above objects, a multiple character code set input/output conversion system for a computer system provided with a plurality of computers handling different kinds of character code sets comprises an input character code conversion means which converts character code strings based on a character code set used in a text file into internal character code strings based on the internal character code set commonly used by the plurality of computers and an output character code conversion means which converts the internal character code strings to other character code strings based on a specific character code set, and the input character code conversion means further comprises a plurality of code conversion programs to convert character code strings based on a plurality of character code sets to internal character code strings based on the internal character code sets, a plurality of conversion tables with arrays of addresses to invoke the code conversion programs and table registers to set pointers to the conversion tables for character code set conversion to which the input character code corresponds, and the output character code conversion means further comprises a plurality of code conversion programs to convert character code strings based on the internal character code set to character code strings based on the plurality of character code sets, a plurality of conversion tables with arrays of addresses to invoke the code conversion programs and table registers to set pointers to the conversion tables for character code set conversion to which the character code string to be output corresponds.

According to still another preferred embodiment, a multiple character code set input/output conversion system further comprises an input character code string storage to store character code strings to be converted to internal character code strings based on the internal character code set by the input character code conversion means, an internal character code string storage to store the internal character code strings after conversion and an output character code storage to store character code strings converted from internal character code strings based on the internal character code set by the output character code conversion means.

According to further preferred embodiment of a multiple character code set input/output conversion system, the input character code conversion means further comprises an input conversion control means to control character code conversion which, according to the type of the character code set used by the input character code string, sets the pointer to the applicable conversion table corresponding to the character code set at the table register, looks up the conversion table pointed by the pointer using the read character code values as indices and invokes and executes the predetermined code conversion program and the output character code conversion means further comprises an output conversion control means to control character code conversion which, according to the type of the character code set used by the character code string to be output, sets the pointer to the applicable conversion table corresponding to the character code set at the table register, looks up the conversion table pointed by the pointer using the read character code values as indices and invokes and executes the predetermined code conversion program.

Other objects, characteristics and effects of the present invention will be clarified in the detailed description below.

DESCRIPTION OF THE PREFERRED EMBODIMENT

Referring to the attached figures, preferred embodiments of the present invention will be described in detail below.

Figure 1A:
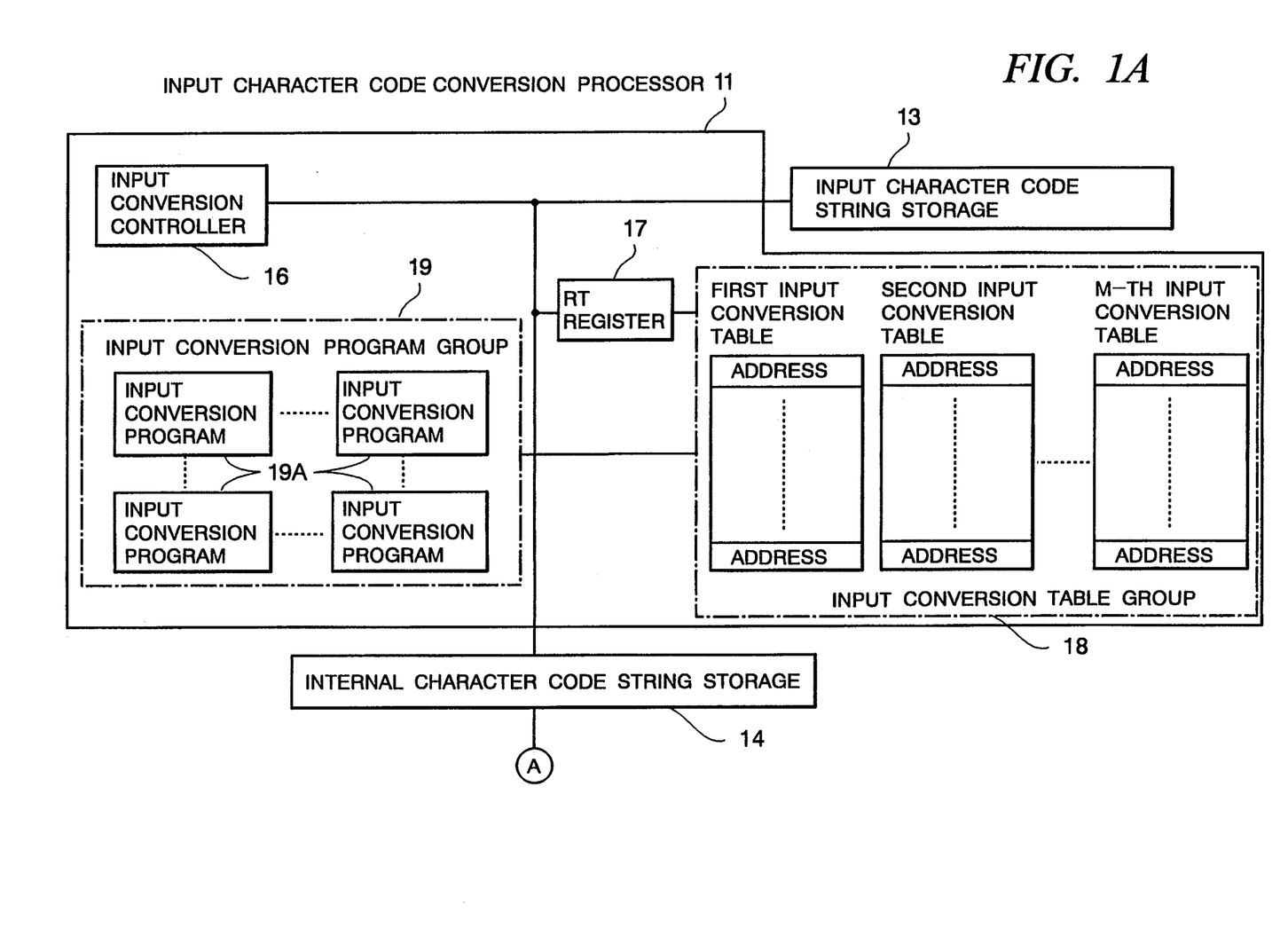
FIGS. 1a and 1b are block diagrams to show the configuration of a multiple character code set input/output conversion system according to a preferred embodiment of the present invention.
Figure 1B:
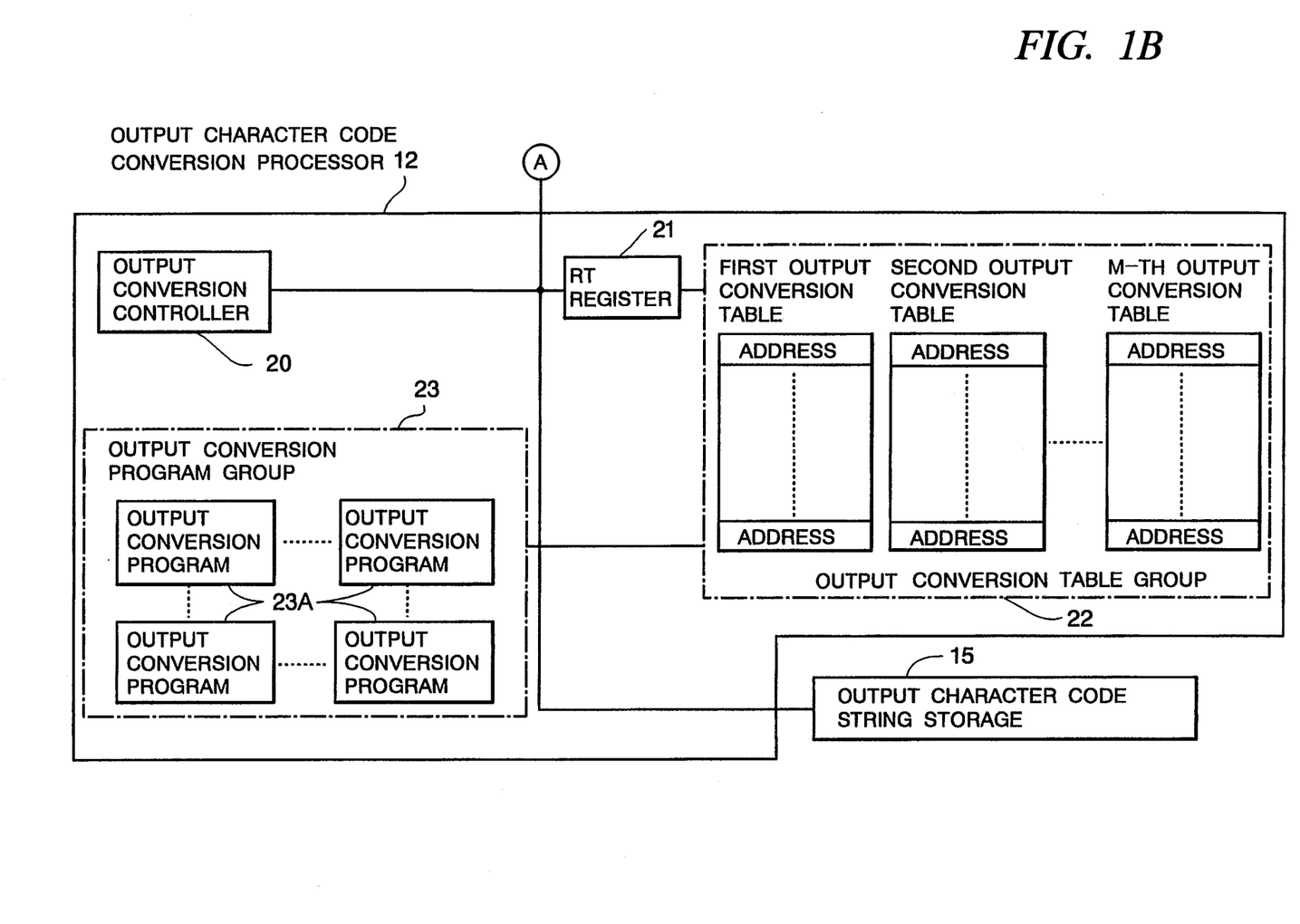

FIG. 1 is a block diagram to show the configuration of a multiple character code set conversion system according to a preferred embodiment of the present invention. In this embodiment, a multiple character code set conversion system comprises an input character code conversion processor 11, an output character code conversion processor 12, an input character code string storage 13 to store input character code strings, an internal character code string storage 14 to store internal character code strings and an output character code string storage 15 to store output character code strings. This multiple character code set conversion system is applied to a computer system where processing is executed among a plurality of computers each of which handles different character code sets and is provided to each of the computers.

The input character code conversion processor 11 consists of an input conversion controller 16, an input conversion table register (RT register) 17, an input conversion table group 18 and an input conversion program group 19. The input conversion table group 18 includes m (positive integer) input conversion tables. There exists one or more input conversion table for a single character code set in the input conversion table group 18. The input conversion program group 19 includes a plurality of input conversion programs 19A to convert character code strings according to a plurality of different character code sets into internal character code strings according to the internal character code set which can be commonly handled by the plurality of computers.

The output character code conversion processor 12 comprises an output conversion controller 20, an output conversion table register (PT register) 21, an output conversion table group 22 and an output conversion program group 23. The output conversion table group 22 includes m (positive integer) output conversion tables. There exists one or more output conversion table for a single character code set in the output conversion table group 22. The output conversion program group 23 includes a plurality of output conversion programs 23A to convert internal character code strings expressed according to the internal character code set into character code strings according to a plurality of different character code sets.

The input conversion controller 16 in the input character code conversion processor 11 acquires the input conversion table (specific input conversion table in the input conversion table group 18 prepared in advance) pointed by the RT register 17 in order to cause the input character code strings in a text file stored in the input character code string storage 13 to be converted to internal character code strings. At the RT register 17, initial pointers are set so as to indicate the input conversion tables corresponding to the character code sets defining the input character code strings.

The input conversion controller 16 further receives the character codes in the input character code strings, looks up the applicable input conversion table using the values of the above input codes as indices and invokes the applicable input conversion program in the input conversion program group 19. An input conversion table is an array of addresses of the input conversion programs to be invoked corresponding to the character code set. As indices for the array, the code values of the input character codes are used. The invoked input conversion program converts the character codes received by the input conversion controller 16 into internal character codes (character codes based on the character code set commonly used by a plurality of computer in the computer system) and stores such internal character codes in the internal character code string storage 14.

On the other hand, the output conversion controller 20 in the output character code conversion processor 12 acquires the output conversion table (output conversion table in the output conversion table group 12 prepared in advance) pointed by the PT register 11 in order to cause the internal character code strings to be converted to output character codes and output to a text file. At the PT register 11, initial pointers are set so as to indicate the output conversion tables corresponding to the character code sets defining the output character code strings.

The output conversion controller 20 further receives the internal character codes in the internal character code strings, looks up the applicable output conversion table using the values of the above internal character codes as indices and invokes the applicable output conversion program in the output conversion program group 23. An output conversion table is an array of addresses of the output conversion programs to be invoked corresponding to the character code set, and the code values of the internal character codes are used as indices for the array. The invoked output conversion program converts the internal character codes received by the output conversion controller 20 into character codes conforming to the character code set appropriate for output and stores such character codes to the output character code string storage 15.

Referring now to FIGS. 2 to 11, the operation of a multiple character code set input/output conversion system according to this embodiment is described.

Firstly, suppose there are two types of character code sets handled by computers whose one byte corresponds to eight bits: character code sets A and B.

Figure 2:
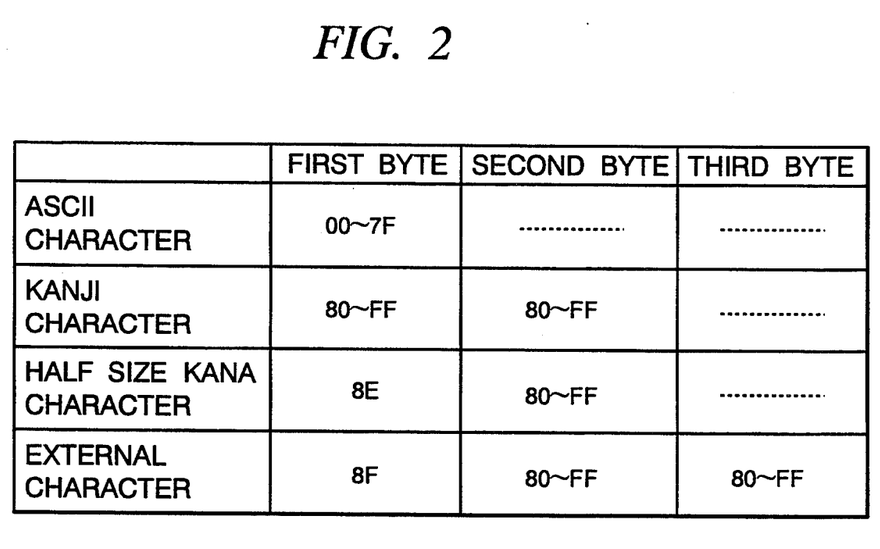
FIG. 2 is a diagram to show an example of character code sets applicable to a multiple character code set input/output conversion system.

As shown in FIG. 2, the character code set A has characters each of which is expressed by one to three bytes. They are defined as follows:

(1) An ASCII character is expressed with one byte. It may have a code value within the range form "00" to "7F" (code values in hexadecimal notation).

(2) A Kanji character is expressed with two bytes. It may have has a code value within the range form "80" to "FF" at the first and the second bytes.

(3) A half size kana character is expressed with two bytes. The first byte has a code value "8E" and the second byte may have a code value within a range from "80" to "FF".

(4) A user-defined external character is expressed with three bytes. The first byte has a character code "8F" and the second and the third byte code values are in the range from "80" to "FF" respectively.

The character code set B has two types of characters: those expressed with one byte and those with two bytes. They are defined as follows:

(1) An ASCII character is expressed with one byte.

(2) A Kanji character is expressed with two bytes.

(3) A half size kana character is expressed with one byte.

(4) An external character is expressed with two bytes.

(5) Certain character code strings are inserted for distinction between ASCII characters and half size kana characters (both in one byte) as well as Kanji characters and external characters (both in two bytes): when a one-byte character is followed by a two-byte character, a character code string "1B2442" (hereinafter referred to as "KI character code string") is inserted between them. When a two-byte character is followed by a one-byte character, a character code string "1B284A" (hereinafter referred to as "KO character code string") is inserted between them. Note that any of one-byte or two-byte characters do not have a code value beginning with "1B".

Figure 3:
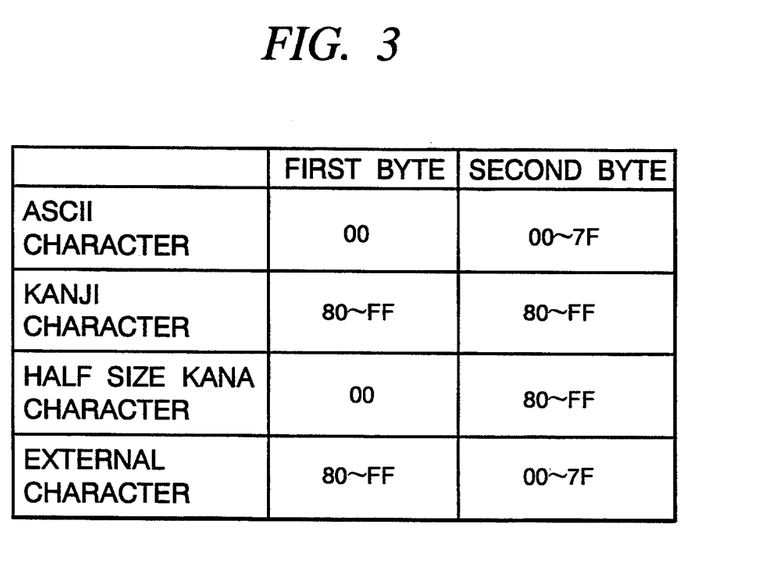
FIG. 3 is a diagram to show an example of the internal character code set used in a multiple character code set input/output conversion system.

As shown in FIG. 3, the internal character code set applicable to the multiple character code set input/output conversion system of this embodiment has all characters expressed with two bytes. This internal character code set is defined based on the character code set A and its characters are defined as follows:

(1) An ASCII character has "00" as the code value for the first byte; for the second byte, the second byte code value for the ASCII character in the character code set A is used as the code value.

(2) A Kanji character is defined as in the character code set A.

(3) A half size kana character has "00" as the code value for the first byte; for the second byte, the second byte code value for the half size kana character in the character code set A is used as the code value.

(4) An external character has the second byte value for the external character in the character code set A for the first byte; for the second byte, the value obtained by deducting "80" from the third byte value for the external character in the character code set A is used.

Figure 4A:
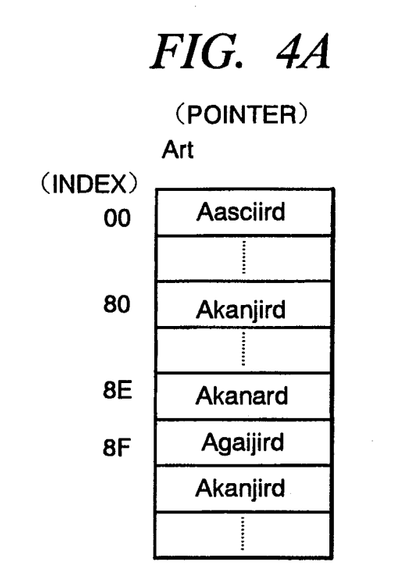
FIGS. 4a, 4b and 4c show specific examples of input conversion tables in an input conversion table group.

As shown in FIG. 4A, the input conversion table Art corresponding to the character code set A has pointers to the input conversion program Aasciird set at the indices 00 to 7F (index numbers are in hexadecimal notation); It has a pointer to the input conversion program Akanard at the element 8E and a pointer to the input conversion program Agaijird at the element 8F. At the remaining elements, the pointers to the input conversion program Akanjird are set.

Figure 4B:
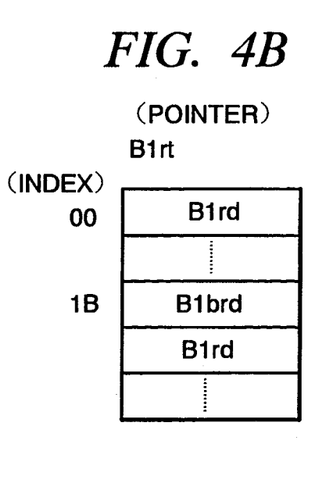

As shown in FIG. 4B, one of the input conversion tables corresponding to the character code set B (the input conversion table B1rt used for one byte character conversion) has at index 1B a pointer to the input conversion program B1brd and at other indices has the pointers to the input conversion program B1rd.

Figure 4C:
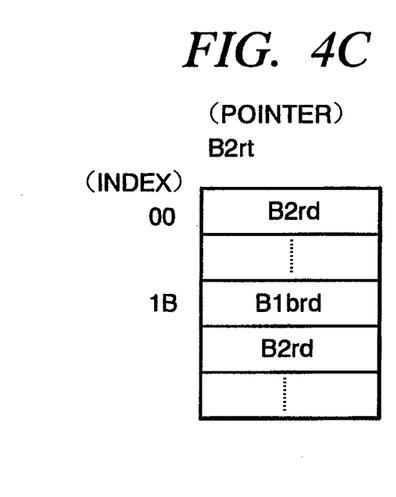

As shown in FIG. 4C, one of the input conversion tables corresponding to the character code set B (input conversion table B2rt used for two byte character conversion) has at index 1B a pointer to the input conversion program B1brd and at other indices has the pointers to the input conversion program B2rd.

Figure 5A:
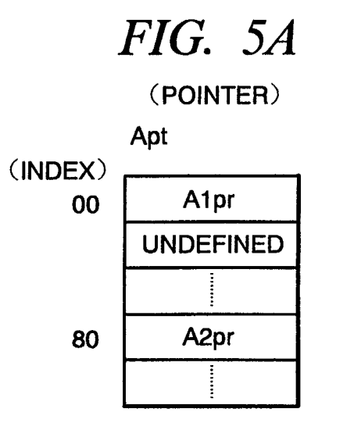
FIGS. 5A-5C show specific examples of output conversion tables in an output conversion table group.

As shown in FIG. 5A, the output conversion table Apt corresponding to the character code set A has at index 00 a pointer to the output conversion program A1pr and at indices 80 to FF the pointers to the output conversion program A2pr. Other indices are not defined.

Figure 5B:
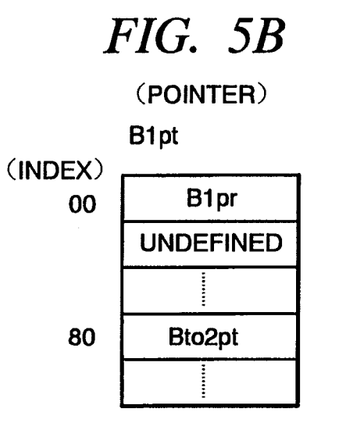

As shown in FIG. 5B, one of the output conversion tables corresponding to the character code set B (the output conversion table B1pt used for 1 byte character conversion) has at index 00 a pointer to the output conversion program B1pr and at indices 80 to FF pointers to the output conversion program B1to2pr. Other indices are not defined.

Figure 5C:
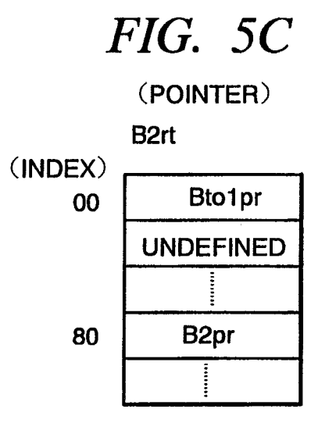

As shown in FIG. 5C, another one of the output conversion tables corresponding to the character code set B (input conversion table B2pt used for 2 byte character conversion) has at index 00 a pointer to the output conversion program Bto1pr and at indices 80 to FF pointers to the output conversion program B2pr.

Figure 6:
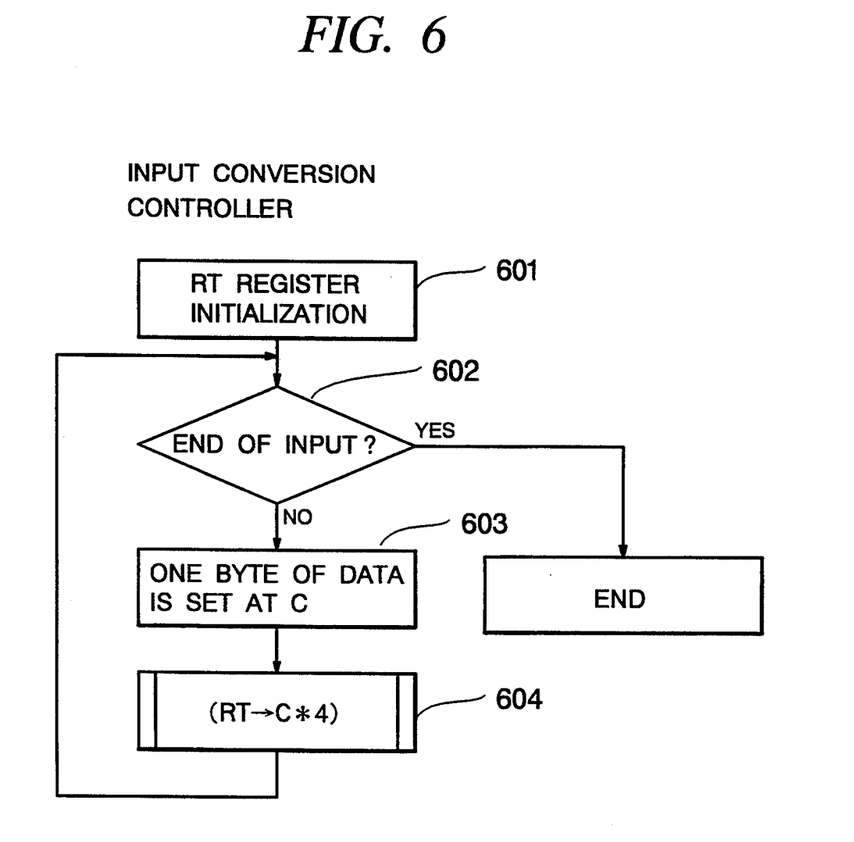
FIG. 6 is a flowchart to illustrate the processing at an input conversion controller.
Figure 7A:
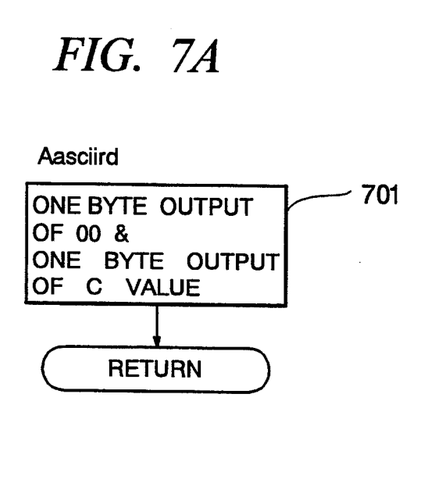
FIGS. 7A-7D give flowcharts to illustrate the processing of input conversion programs according to an example.
Figure 7B:
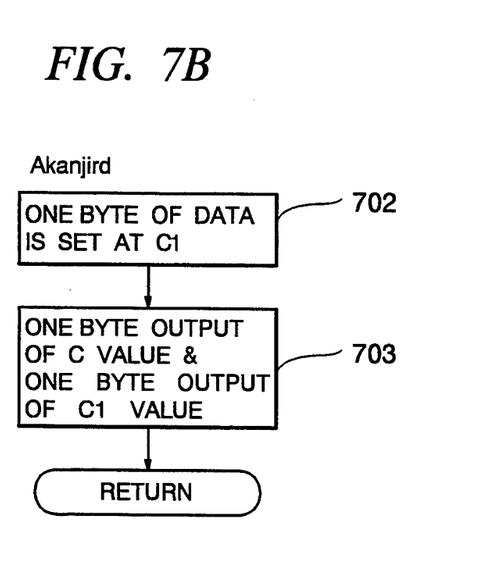
Figure 7C:
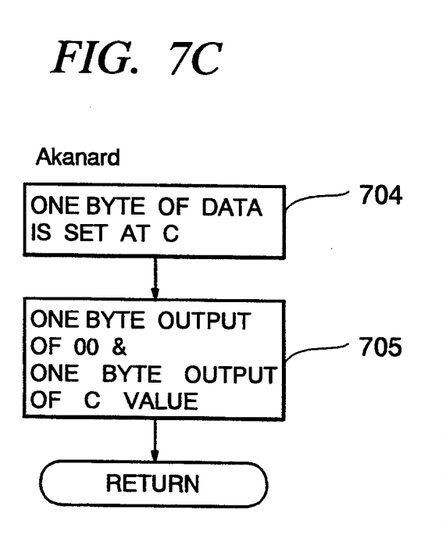
Figure 7D:
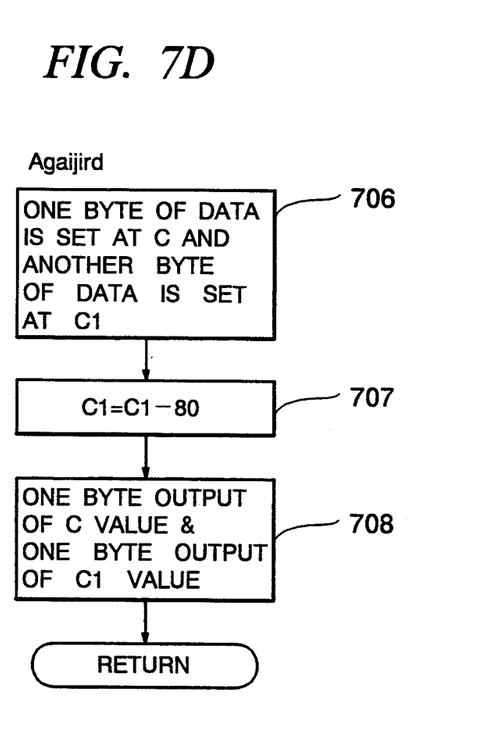
Figure 8A:
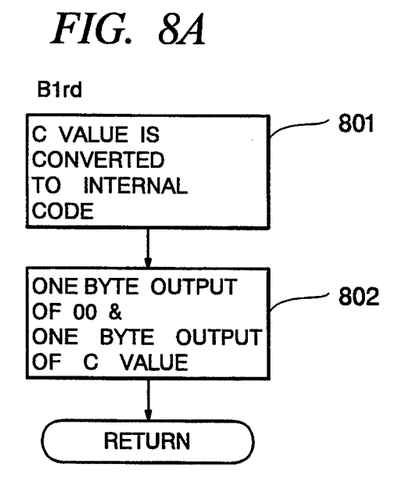
FIGS. 8A-8C give flowcharts to illustrate the processing of input conversion programs according to another example.
Figure 8B:
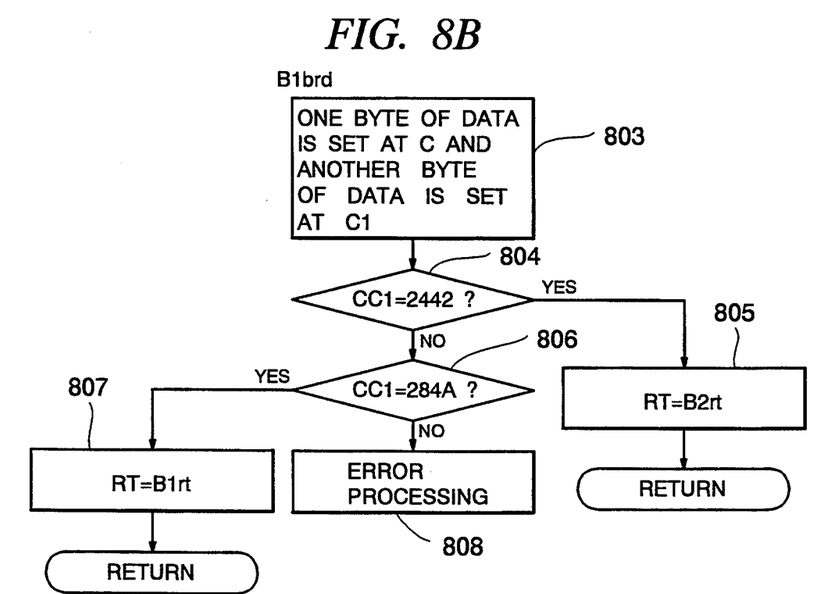
Figure 8C:
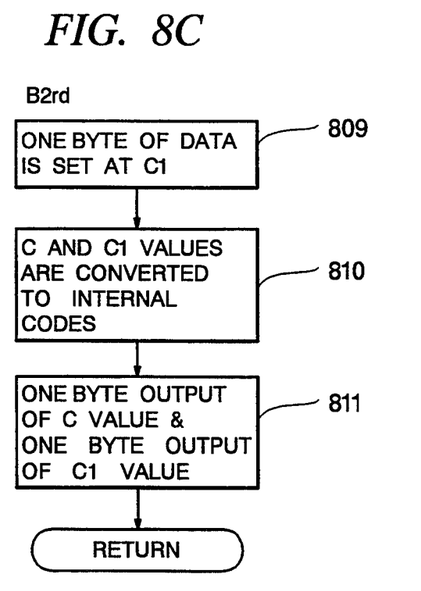

Referring now to the flowcharts in FIGS. 6 to 8 illustrating the processing of the input conversion controller 16, the RT register 17 is initialized first. Specifically, when the character code strings in the input character code string storage 13 are based on the character code set A, the pointer to the input conversion table Art is set at the RT register 17. When the character codes are based on the character code set B, the pointer to the input conversion table B1rt is set at the RT register 17 (Step 601).

One-byte character codes are read from the input character code string storage 13 storing the input character code strings until all the codes are input (Step 602). The read character codes are set at the work register C (not shown) for the input character code conversion processor 11 and the output character code conversion processor 20 (Step 603). By lookup of the input conversion table pointed by the RT register 17 with using the work register values, the applicable input conversion program is invoked from the input conversion program group 19 (Step 604).

If, in Step 604, the input conversion program Aasciird is invoked, the input conversion program Aasciird performs processing as shown in FIG. 7A. Specifically, the program stores an internal character code having "00" at the first byte and the work register value at the second byte to the internal character code string storage 14 (Step 701).

If, in Step 604, the input conversion program Akanjird is invoked, the input conversion program Akanjird performs processing as shown in FIG. 7B. Specifically, the program reads the subsequent one-byte character code from the input character code string, sets it to the work register C1 (not shown) (Step 702) and stores an internal character code having the value of the work register C at the first byte and the value of the work register C1 to the second byte into the internal character code string storage 14 (Step 703).

If, in Step 604, the input conversion program Akanard is invoked, the input conversion program Akanard performs processing as shown in FIG. 7C. Specifically, the program reads the subsequent one-byte character code from the input character code string, sets it to the work register C (Step 704), and stores an internal character code having "00" at the first byte and the value of the work register C at the second byte to the internal character code string storage 14 (Step 705).

If, in Step 604, the input conversion program Agaijird is invoked, the input conversion program Agaijird performs processing as shown in FIG. 7D. Specifically, the program reads the subsequent one-byte character code from the input character code string and sets it to the work register C, then reads the next subsequent one-byte character code and sets it to the work register C1 (Step 706), deducts "80" from the value of the register C1 (Step 707) and stores an internal character code having the value of the work register C at the first byte and the value of the work register C1 at the second byte to the internal character code string storage 14 (Step 708).

If, in Step 604, the input conversion program B1rd is invoked, the input conversion program B1rd performs processing as shown in FIG. 8A. Specifically, the program converts the value of the work register C to the corresponding internal character code (Step 801) and stores that internal character code to the internal character code string storage 14 (Step 802).

If, in Step 604, the input conversion program B1brd is invoked, the input conversion program B1brd performs processing as shown in FIG. 8B. Specifically, the program reads the subsequent one-byte character code from the input character code string and sets it to the work register C and reads the next subsequent one-byte character code and sets it to the work register C1 (Step 803). If the values of the work registers C and C1 are "2442" (Step 804), then the pointer to the input conversion table B2rt is set at the RT register 17 (Step 805). If the values at the work registers C and C1 are "284A" (Step 806), then the pointer to the input conversion table B1rt is set at the RT register (Step 807). If the values of the work registers C and C1 are neither "2442" or "284A", certain error processing is performed (Step 808).

If, in Step 604, the input conversion program B2rd is invoked, the input conversion program B2rd performs processing as shown in FIG. 8C. Specifically, the program reads the subsequent one-byte character code from the input character code string and sets it to the work register C1 (Step 809), converts the values at the work registers C and C1 to the corresponding internal character codes (Step 810), and then stores these internal character codes to the internal character code string storage 14 (Step 811).

The above conversions from the character code set B to the internal character code set are performed through look-up of the applicable conversion table or through calculation using formulae for code conversion between two character codes.

Figure 9:
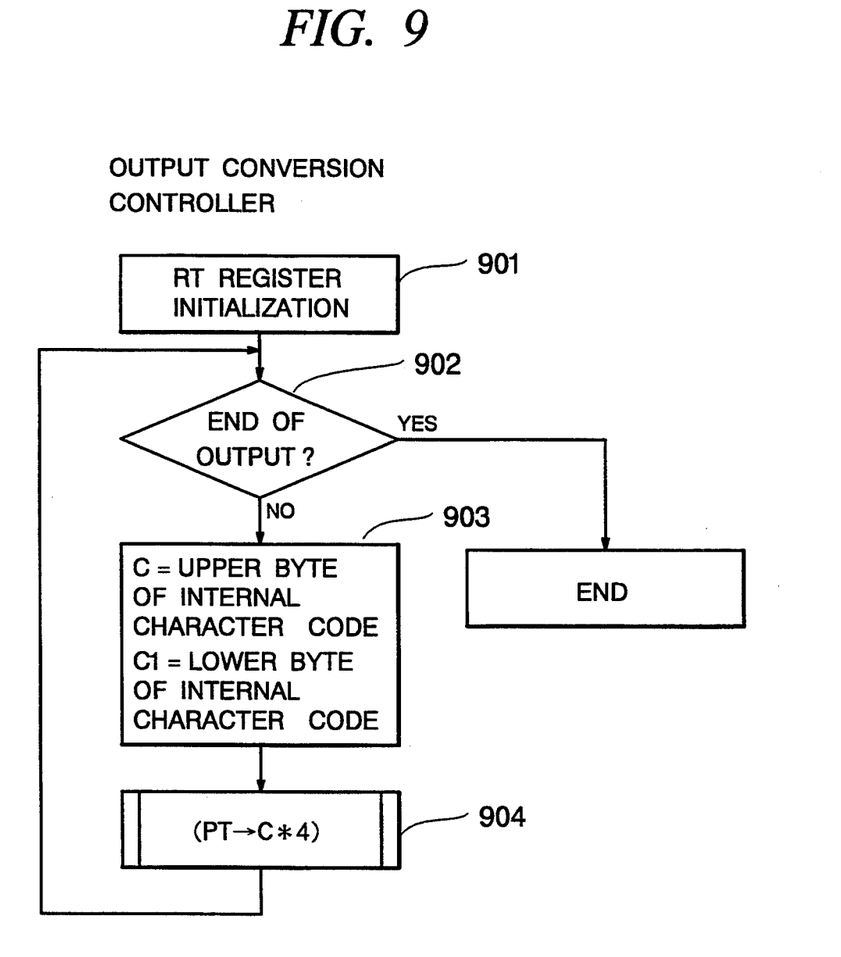
FIG. 9 is a flowchart to illustrate the processing at an output conversion controller.
Figure 10A:
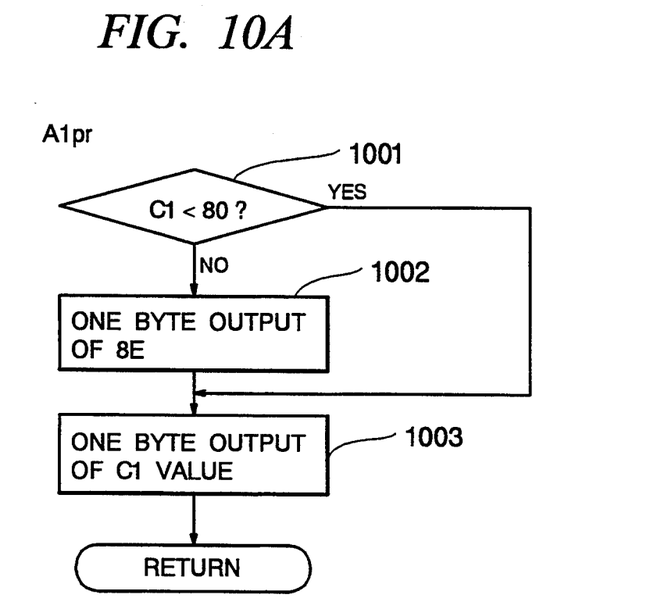
FIGS. 10A-10B give flowcharts to illustrate the processing of output conversion programs according to an example.
Figure 10B:
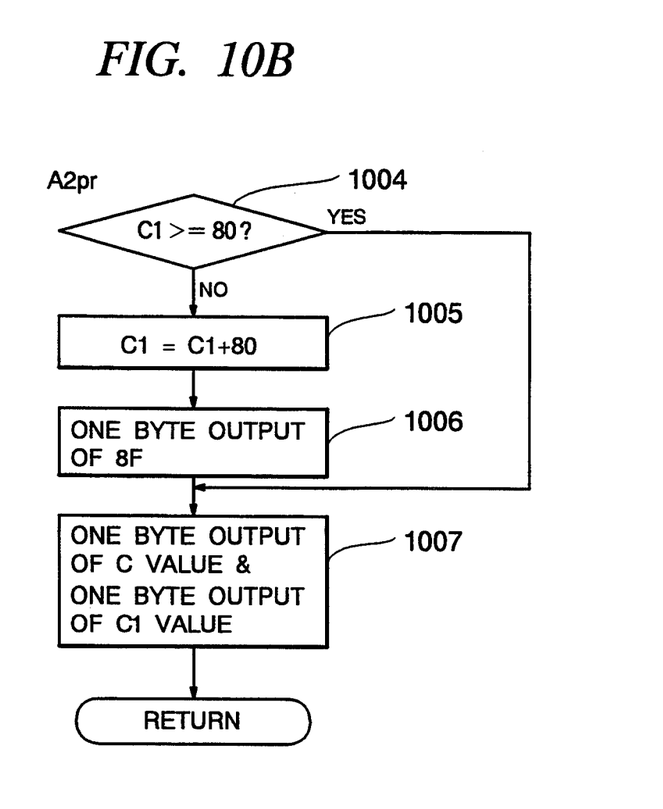

Referring now to the flowcharts in FIGS. 9 to 11 illustrating the processing by the output conversion controller 20 in the output character code conversion processor 12, the PT register 21 is initialized first. Specifically, when the input character code strings to be output (the character code strings to be stored to the output character code string storage 15) are based on the character code set A, the pointer to the output conversion table Apt is set at the PT register 21. When the character codes are based on the character code set B, the output conversion table B1pt is set at the PT register 21 (Step 901).

Internal character codes are read from the internal character code strings stored in the internal character code string storage 13 until all the internal character codes are sent (Step 902). The internal character code at the first byte (upper byte) is set to the work register C and the internal character code at the second byte (lower byte) is set to the work register C1 (Step 903). Then, the controller invokes the applicable output conversion program from the output conversion program group 23 by looking up the output conversion table pointed by the PT register 21 with using the value of the work register C (Step 904).

If, in Step 904, the output conversion program A1pr is invoked, the output conversion program A1pr performs processing as shown in FIG. 10A. Specifically, when the work register C1 has a value not less than "80" (Step 1001), the program outputs "8E" to the output character code string storage 15 (Step 1002), and then outputs the value of the work register C1 to the output character code string storage 15 (Step 1003). When the value of the work register C1, the program stores an internal character code having "00" at the first byte and the value of the work register at the second byte to the internal character code string storage 14 (Step 701). When the work register C1 has a value less than "80" (Step 1001), the value of the work register C1 is sent to the output character code string storage 15 (Step 1003).

If, in Step 904, the output conversion program A2pr is invoked, the output conversion program A2pr performs processing as shown in FIG. 10B. Specifically, when the work register C1 has a value less than "80" (Step 1004), the program adds "80" to the value of the work register C1 (Step 1005) and outputs "8F" to the output character code string storage 15 (Step 1006). Then the program subsequently outputs the values of the work registers C and C1 to the output character code string storage 15 (Step 1007). When the work register C1 has a value not less than "80" (Step 1004), the program subsequently outputs the values of the work registers C and C1 to the output character code string storage 15 (Step 1007).

Figure 11A:
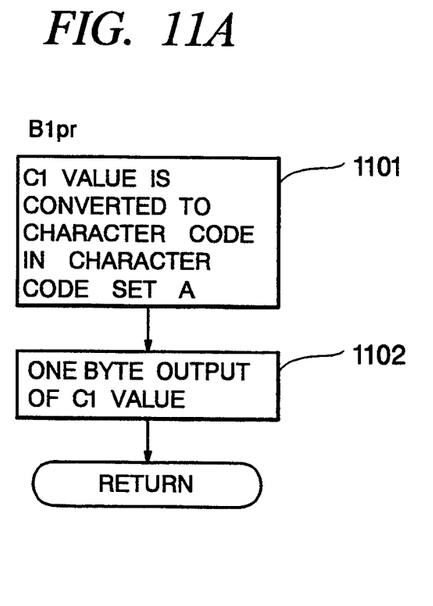
FIGS. 11A-11D give flowcharts to illustrate the processing of output conversion programs according to another example.

If, in Step 904, the output conversion program B1pr is invoked, the output conversion program B1pr performs processing as shown in FIG. 11A. Specifically, the program converts the value of the work register C1 (internal character code) to a corresponding character code based on the character code set B (Step 1101) and stores that character code (value of the work register C1 after conversion) to the output character code string storage 15 (Step 1102).

Figure 11B:
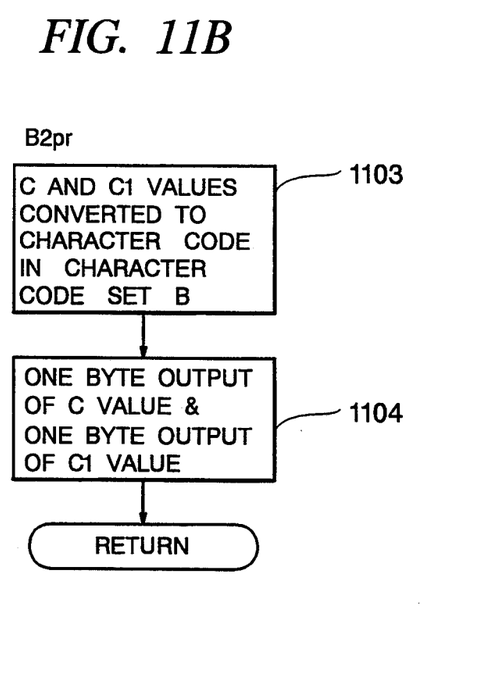

If, in Step 904, the output conversion program B2pr is invoked, the output conversion program B2pr performs processing as shown in FIG. 11B. Specifically, the program converts the values of the work registers C and C1 (internal character codes) to corresponding character codes based on the character code set B (Step 1103) and stores these character codes to the output character code string storage 15 (Step 1104).

Figure 11C:
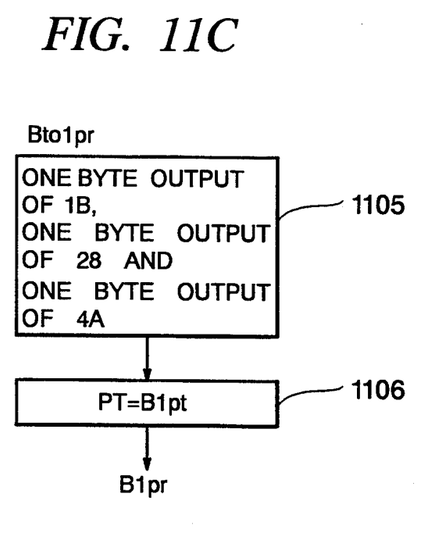

If, in Step 904, the output conversion program Bto1pr is invoked, the output conversion program Bto1pr performs processing as shown in FIG. 11C. Specifically, the program sends a KO character code string "1B284A" to the output character code string storage 15 (Step 1105), sets the pointer to the output conversion table B1pt at the PT register 21 (Step 1106), and branches to the output conversion program B1pr.

Figure 11D:
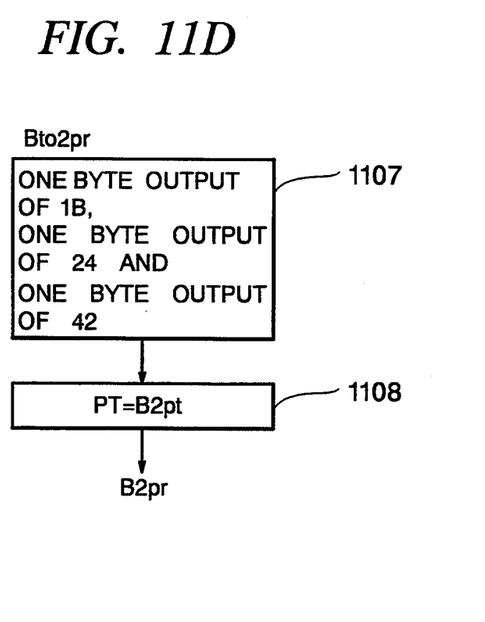

If, in Step 904, the output conversion program Bto2pr is invoked, the output conversion program Bto2pr performs processing as shown in FIG. 11D. Specifically, the program sends a KI character code string "1B2442" to the output character code string storage 15 (Step 1107), sets the pointer to the output conversion table B2pt at the PT register 21 (Step 1108), and branches to the output conversion program B2pr.

The above conversions from the internal character code set to the character code set B are performed through look-up of the applicable conversion table or through calculation using formulae for code conversion between the two character codes.

Figure 12A:
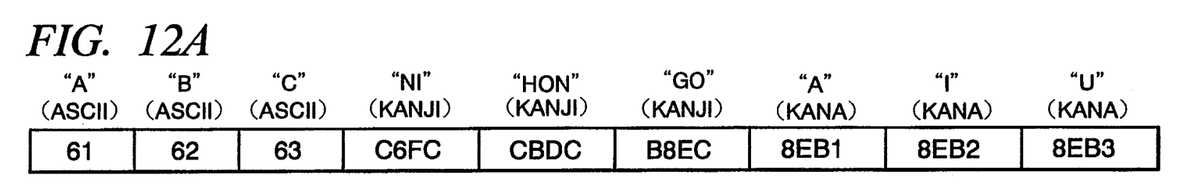
FIGS. 12A-12D are diagrams to illustrate specific conversion examples at a multiple character code set input/output conversion system.
Figure 12B:
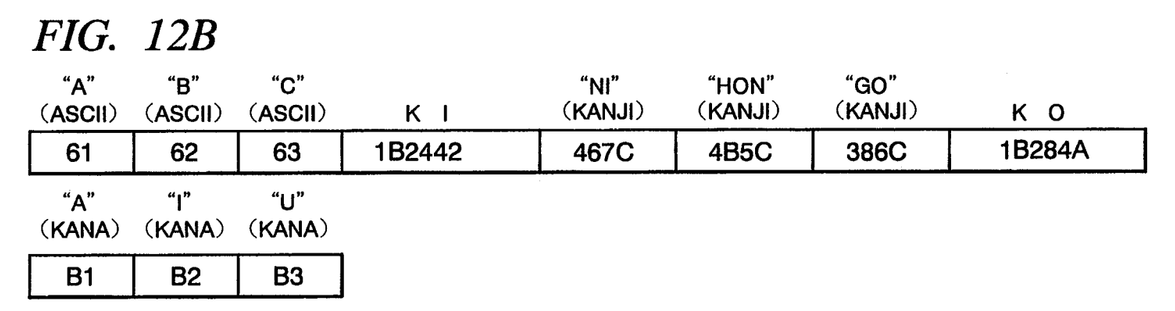
Figure 12C:
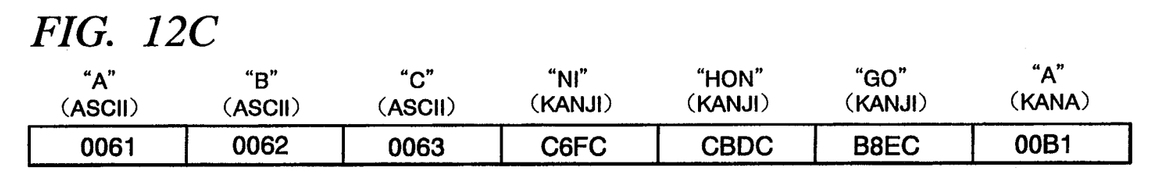
Figure 12D:
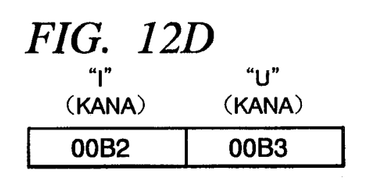

Next, a specific conversion example using the multiple code set input/output conversion system according to this embodiment is described referring to FIGS. 12A to 12C. Suppose here that the character code string representing "ABC" (ASCII character), "NI HON GO" (Kanji character), "A I U" (Half size kana character) is input and output.

FIG. 12A shows a character code string for "ABC" (ASCII character), "NI HON GO" (Kanji character), "A I U" (Half size kana character) expressed according to the character code set A. FIG. 12B shows another character code string for "ABC" (ASCII character), "NI HON GO" (Kanji character), "A I U" (Half size kana character) expressed according to the character code set B. FIG. 12C shows still another character code string for "ABC" (ASCII character), "NI HON GO" (Kanji character), "A I U" (Half size kana character) expressed according to the internal code set.

Firstly, the operation at the input character code conversion processor 11 is described. When the pointer to the input conversion table Art is set at the RT register 17 and the input character code string according to the character code set A in FIG. 12A is sent as the input character code string from the input character code string storage 13, the following processes are performed:

(1) The input conversion program Aasciird converts the character codes "61", "62" and "63" into the internal character codes "0061", "0062" and "0063" and these internal codes after conversion are sent to the internal character code string storage 14;

(2) The input conversion program Akanjird sets the character codes "C6FC", "CBDC" and "B8EC" to the internal character code string storage 14 as the internal codes "C6FC", "CBDC" and "B8EC"; and (3) The input conversion program Akanard converts the character codes "8EB1", "8EB2" and "8EB3" to the internal codes "00B1", "00B2" and "00B3" respectively and these internal codes after conversion are sent to the character code string storage 14.

Thus, through the processes (1) to (3), the internal character code string as shown in FIG. 12C can be obtained.

On the other hand, when the pointer to the input conversion table B1rt is set at the RT register 17 and the character code string according to the character code set B as in FIG. 12B is sent as the input character code string, the following processes are performed:

(1) The input conversion program B1rd converts the character codes "61", "62" and "63" in FIG. 12B into the internal character codes "0061", "0062" and "0063" and these internal codes after conversion are sent to the internal character code string storage 14;

(2) Upon input of the character code string "1B2442" (KI character code string), the input conversion program B1brd sets the pointer to the input conversion table B2rt at the RT register 17;

(3) The input conversion program B2rd converts the character codes "467C", "4B5C" and "386C" to the internal codes "C6FC", "CBDC" and "B8EC" and these internal codes after conversion are sent to the internal character code string storage 14;

(4) Upon input of the character code string "1B284A" (KO character code string), the input conversion program B1brd sets the pointer to the input conversion table B1rt at the RT register 17 and (5) The input conversion program B1rd converts the character codes "1", "B2" and "B3" to the internal codes "00B1", "00B2" and "00B3" respectively and these internal codes after conversion are sent to the character code string storage 14.

Thus, through the processes (1) to (5) above, the internal character code string as shown in FIG. 12C can be obtained.

Secondly, the operation at the output character code conversion processor 12 is explained. When the pointer to the output conversion table Apt is set at the PT register 21 and the character code string as in FIG. 12C is set at the internal character code string storage 14, the following processes are performed:

(1) The output conversion program A1pr converts the internal character codes "0061", "0062" and "0063" into the character codes "61", "62" and "63" and the character codes after conversion are sent to the output character code string storage 15;

(2) The output conversion program A2pr sends the internal character codes "C6FC", "CBDC" and "B8EC" to the output character code string storage 15 as character codes "C6FC", "CBDC" and "B8EC";

(3) The output conversion program A1pr converts the internal character code strings "00B1", "00B2" and "00B3" into the character codes "8EB1", "8EB2" and "8EB3" and these character codes after conversion are sent to the output character code string storage 15.

Thus, through the processes (1) to (3) above, the character code string in the character code set A as shown in FIG. 12A is reproduced at the output character code string storage 15.

On the other hand, when the pointer to the output conversion table B1pt is set at the PT register 21 and the character code string as in FIG. 12C is set at the internal character code string storage 14, the following processes are performed:

(1) The output conversion program B1pr converts the internal character codes "0061", "0062" and "0063" into the character codes "61", "62" and "63" and these character codes after conversion are sent to the output character code string storage 15;

(2) The output conversion program Bto2pr outputs the KI character code string "1B2442" based on the internal character code "C6FC" to the output character code string storage 15, and sets the pointer to the output conversion table B2pt at the PT register 21;

(3) The output conversion program B2pr converts the internal character codes "C6FC", "CBDC" and "B8EC" into the character codes "467C", "4B5C" and "386C" and these character codes after conversion are sent to the output character code string storage 15;

(4) The output conversion program Bto1pr sends the KO character code string "1B284A" based on the internal character code "00B1" to the output character code string storage 15, and sets the pointer to the output conversion table B1pt at the PT register 21;

(5) The output conversion program B1pr converts the internal character code strings "00B1", "00B2" and "00B3" into the character codes "B1", "B2" and "B3" and these character codes after conversion are sent to the output character code string storage 15.

Thus, through the processes (1) to (5) above, the character code string in the character code set B as shown in FIG. 12B is reproduced at the output character code string storage 15.

As described above, the present invention makes conversions into internal character codes which can be commonly handled in input/output processing of character codes expressed with a plurality types of (multiple) character code sets. This eliminates the need of a plurality of text files having the same contents but expressed in different character code sets in a computer system handling different character code sets. In other words, when providing a computer system where a plurality of character code sets are handled, it becomes unnecessary to prepare a plurality of text files with the same contents but in different character code sets through conversions, which eliminates the need of resources for a plurality of text files.

Obviously, various modifications can be made to the above embodiment. For example, though there are two character code sets A and B and the internal character code set in the above embodiment, the number of character code sets can be more or less. It is intended to cover in the appended claims all such modifications and variations as fall within the true spirit and scope of the present invention.

What is claimed is:

1. A multiple character code set input/output conversion system for a computer system provided with a plurality of computers handling different kinds of character code sets comprising:

an input character code conversion means for converting character code strings based on a character code set used in a text file into internal character code strings based on an internal character code set commonly used by said plurality of computers, and an output character code conversion means for converting said internal character code strings to other character code strings based on a specific character code set.

2. A multiple character code set input/output conversion system of claim 1 wherein said input character code conversion means further comprises a plurality of code conversion programs to convert character code strings based on a plurality of character code sets to internal character code strings based on said internal character code set, and a plurality of input conversion tables with arrays of addresses to invoke said code conversion programs, and said output character code conversion means further comprises a plurality of code conversion programs to covert character code strings based on said internal character code set to character code strings based on a plurality of character code sets, and a plurality of output conversion tables with arrays of addresses to invoke said code conversion programs.

3. A multiple character code set input/output conversion system of claim 2 wherein
said input conversion table and said output conversion table use the values of the character codes to be converted as indices for said arrays of addresses.

4. A multiple character code set input/output conversion system of claim 2 wherein
said input character code conversion means further comprises a table register to set a pointer to the input conversion table for character code set conversion to which the input character code corresponds, and
said output character code conversion means further comprises a table register to set a pointer to the output conversion table for character code set conversion to which the character code string to be output corresponds.

5. A multiple character code set input/output conversion system of claim 1 further comprising
an input character code string storage to store character code strings to be converted to internal character code strings based on the internal character code set by said input character code conversion means,
an internal character code string storage to store said converted internal character code strings, and
an output character code storage to store character code strings converted from an internal character code strings based on the internal character code set by said output character code conversion means.

6. A multiple character code set input/output conversion system for a computer system provided with a plurality of computers handling different kinds of character code sets comprising:
an input character code conversion means for converting character code strings based on a character code set used in a text file into internal character code strings based on an internal character code set commonly used by said plurality of computers, and
an output character code conversion means for converting said internal character code strings to other character code strings based on a specific character code set,
said input character code conversion means further comprising
a plurality of code conversion programs to convert character code strings based on a plurality of character code sets to internal character code strings based on said internal character code sets,
a plurality of conversion tables with arrays of addresses to invoke said code conversion programs, and
table registers to set pointers to the conversion tables for character code set conversion to which the input character code corresponds, and said output character code conversion means further comprising
a plurality of code conversion programs to convert character code strings based on said internal character code set to character code strings based on said plurality of character code sets,
a plurality of conversion tables with arrays of addresses to invoke said code conversion programs, and
table registers to set pointers to the conversion tables for character code set conversion to which the character code string to be output corresponds.

7. A multiple character code set input/output conversion system of claim 6 further comprises
an input character code string storage to store character code strings to be converted to internal character code strings based on the internal character code set by said input character code conversion means,
an internal character code string storage to store said internal character code strings after conversion,
an output character code storage to store character code strings converted from internal character code strings based on the internal character code set by said output character code conversion means.

8. A multiple character code set input/output conversion system of claim 6 wherein
said input character code conversion means further comprises an input conversion control means for controlling character code conversion which, according to the type of the character code set used by the input character code string, sets the pointer to the applicable conversion table corresponding to the character code set at said table register, looks up said conversion table pointed by said pointer using the read character code values as indices and invokes and executes the predetermined code conversion program, and
said output character code conversion means further comprises an output conversion control means for controlling character code conversion which, according to the type of the character code set used by the character code string to be output, sets the pointer to the applicable conversion table corresponding to the character code set at said table register, looks up said conversion table pointed by said pointer using the read character code values as indices and invokes and executes the predetermined code conversion program.

9. A multiple character code set input/output conversion system for computer systems handling a plurality of mutually distinct character code sets, comprising:
means for establishing a common code set common in said computer systems;
means for inputting a first text data described in a first character code set;
means for receiving input first text data and converting said first text data into a common text data described by said common code set;
means for converting said common text data into a second text data described by a second character code set distinct from said first character code set; and
means for outputting said second text data.

* * * * *